US011121296B2

(12) United States Patent
Kikuchi et al.

(10) Patent No.: US 11,121,296 B2
(45) Date of Patent: *Sep. 14, 2021

(54) TRANSPARENT SEALING MEMBER HAVING AT LEAST ONE CORNER PORTION IN CURVED SHAPE AND METHOD FOR MANUFACTURING SAME

(71) Applicant: NGK Insulators, Ltd., Nagoya (JP)

(72) Inventors: Yoshio Kikuchi, Nagoya (JP); Hiroyuki Shibata, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,138

(22) Filed: Dec. 23, 2019

(65) Prior Publication Data

US 2020/0135992 A1  Apr. 30, 2020

Related U.S. Application Data

(63) Continuation of application No. PCT/JP2018/013303, filed on Mar. 29, 2018.

(30) Foreign Application Priority Data

Jun. 27, 2017  (WO) .................. PCT/JP2017/023547

(51) Int. Cl.
*H01L 33/58* (2010.01)
*H01L 33/00* (2010.01)
(Continued)

(52) U.S. Cl.
CPC .......... *H01L 33/58* (2013.01); *H01L 33/0095* (2013.01); *H01L 33/22* (2013.01); *H01L 33/483* (2013.01); *H01L 33/62* (2013.01)

(58) Field of Classification Search
CPC ....... H01L 2933/005; H01L 2933/0058; H01L 33/58–60; H01L 33/22; H01L 33/483
See application file for complete search history.

(56) References Cited

U.S. PATENT DOCUMENTS 7,144,146 B2 * 12/2006 Takeuchi ............ H01L 51/5262
362/617
10,865,948 B2 * 12/2020 Kikuchi .................. H01L 33/58
(Continued)

FOREIGN PATENT DOCUMENTS

JP  H10-233532 A1  9/1998
JP  2005-175048 A1  6/2005
(Continued)

OTHER PUBLICATIONS

English translation of the International Preliminary Report on Patentability (Application No. PCT/JP2018/013303) dated Jan. 9, 2020.
(Continued)

*Primary Examiner* — Stephen M Bradley
(74) *Attorney, Agent, or Firm* — Burr & Brown, PLLC

(57) ABSTRACT

A first transparent sealing member is used in a package accommodating at least one optical element, and is attached to a mounting substrate having a mounting surface for the optical element. In the first transparent sealing member, at least one corner part among a plurality of corner parts configured by a surface facing the mounting substrate and a surface along the mounting surface of the mounting substrate has a curved shape, and punctiform minute recessed parts are formed on the surface of the curved shape. The average presence frequency of the minute recessed parts is 100,000 to 3,000,000 inclusive per 1 $mm^2$.

11 Claims, 11 Drawing Sheets

(51) Int. Cl.
*H01L 33/22* (2010.01)
*H01L 33/48* (2010.01)
*H01L 33/62* (2010.01)

(56) References Cited

U.S. PATENT DOCUMENTS

| | | |
|---|---|---|
| 2006/0086945 A1 | 4/2006 | Wang et al. |
| 2007/0075306 A1* | 4/2007 | Hayashi ............... H01L 33/641 257/13 |
| 2008/0180960 A1 | 7/2008 | Harrah |
| 2009/0039377 A1 | 2/2009 | Horio et al. |
| 2010/0065929 A1 | 3/2010 | Okada et al. |
| 2013/0049563 A1 | 2/2013 | Kim et al. |
| 2016/0139300 A1* | 5/2016 | Cheng .................... H01L 33/50 362/293 |
| 2016/0190397 A1 | 6/2016 | Lin et al. |
| 2017/0279019 A1 | 9/2017 | Ueda et al. |

FOREIGN PATENT DOCUMENTS

| | | |
|---|---|---|
| JP | 2007-035759 A1 | 2/2007 |
| JP | 2007-116138 A1 | 5/2007 |
| JP | 2010-508652 A1 | 3/2010 |
| JP | 2013-046071 A1 | 3/2013 |
| JP | 5243806 B2 | 7/2013 |
| JP | 2014-236202 A1 | 12/2014 |
| JP | 2015-099948 A1 | 5/2015 |
| JP | 2016-127253 A1 | 7/2016 |
| WO | 2008/023827 A1 | 2/2008 |
| WO | 2016/103547 A1 | 6/2016 |

OTHER PUBLICATIONS

International Search Report and Written Opinion (Application No. PCT/JP2018/013303) dated Jun. 26, 2018.

* cited by examiner

FIG. 9

[TABLE 1]

| | Manufacturing Method | Heat Treatment Temperature | Size of Minute Recesses - Average Width μm | Size of Minute Recesses - Average Depth nm | Number of Minute Recesses - Average Existence Frequency ×10⁴/mm² | Surface Roughness Ra μm | Corner Portion R μm | Linear Transmittance% λ=300nm | Crack Generation Rate |
|---|---|---|---|---|---|---|---|---|---|
| Exemplary Embodiment 1 | Powder Sintering | 1600 to 1700° C | 0.6 | 10 | 29 | 0.017 | ≧5, <150 | 83 | 5/100 |
| Exemplary Embodiment 2 | Powder Sintering | 10° C lower than Exemplary Embodiment 1 | 0.8 | 14 | 76 | 0.028 | ≧150, <300 | 83 | 3/100 |
| Exemplary Embodiment 3 | Powder Sintering | 20° C lower than Exemplary Embodiment 1 | 1.0 | 15 | 188 | 0.013 | ≧300, ≦500 | 81 | 0/100 |
| Comparative Example 1 | Polished Product | — | 1.6 | 0.7 | — | 0.002 | 0 | 88 | 31/100 |
| Comparative Example 2 | Etching of Exemplary Embodiment 1 | 1600 to 1700° C | 1.0 | 29 | 2 | 0.005 | ≧5, <150 | 87 | 16/100 |
| Comparative Example 3 | Powder Sintering | 190° C lower than Exemplary Embodiment 1 | 6.3 | 234 | 2 | 0.165 | ≧300, ≦500 | 5 | 0/100 |

FIG. 10

[TABLE 3]

| | Manufacturing Method | Heat Treatment Temperature | Size of Minute Recesses - Average Width μm | Size of Minute Recesses - Average Depth nm | Number of Minute Recesses - Average Existence Frequency ×10⁴/mm² | Surface Roughness Ra μm | Corner Portion R μm | Linear Transmittance% λ=300nm | Crack Generation Rate |
|---|---|---|---|---|---|---|---|---|---|
| Exemplary Embodiment 7 | Powder Sintering | 1600 to 1700° C | 0.6 | 10 | 29 | 0.017 | ≧5, <150 | 83 | 6/100 |
| Exemplary Embodiment 8 | Powder Sintering | 10° C lower than Exemplary Embodiment 7 | 0.8 | 14 | 76 | 0.028 | ≧150, <300 | 83 | 3/100 |
| Exemplary Embodiment 9 | Powder Sintering | 20° C lower than Exemplary Embodiment 7 | 1.0 | 15 | 188 | 0.013 | ≧300, ≦500 | 81 | 1/100 |
| Comparative Example 5 | Polished Product | — | 1.6 | 0.7 | — | 0.002 | 0 | 88 | 30/100 |
| Comparative Example 6 | Etching of Exemplary Embodiment 7 | 1600 to 1700° C | 1.0 | 29 | 2 | 0.005 | ≧5, <150 | 87 | 22/100 |
| Comparative Example 7 | Powder Sintering | 190° C lower than Exemplary Embodiment 7 | 6.3 | 234 | 2 | 0.165 | ≧300, ≦500 | 5 | 1/100 |

FIG. 11

[TABLE 5]

| | Manufacturing Method | | Heat Treatment Temperature | Size of Minute Recesses | | Number of Minute Recesses | Surface Roughness | Corner Portion R μm | Linear Transmittance% λ=300nm | Crack Generation Rate |
|---|---|---|---|---|---|---|---|---|---|---|
| | | | | Average Width μm | Average Depth nm | Average Existence Frequency ×10⁴/mm² | Ra μm | | | |
| Exemplary Embodiment 13 | Powder Sintering | | 1600 to 1700° C | 0.6 | 10 | 29 | 0.017 | ≧5, <150 | 83 | 7/100 |
| Exemplary Embodiment 14 | Powder Sintering | | 10° C lower than Exemplary Embodiment 13 | 0.8 | 14 | 76 | 0.028 | ≧150, <300 | 83 | 2/100 |
| Exemplary Embodiment 15 | Powder Sintering | | 20° C lower than Exemplary Embodiment 13 | 1.0 | 15 | 188 | 0.013 | ≧300, ≦500 | 81 | 0/100 |
| Comparative Example 9 | Polished Product | | — | 1.6 | 0.7 | — | 0.002 | 0 | 88 | 19/100 |
| Comparative Example 10 | Etching of Exemplary Embodiment 13 | | 1600 to 1700° C | 1.0 | 29 | 2 | 0.005 | ≧5, <150 | 87 | 15/100 |
| Comparative Example 11 | Powder Sintering | | 190° C lower than Exemplary Embodiment 13 | 6.3 | 234 | 2 | 0.165 | ≧300, ≦500 | 5 | 0/100 |

TRANSPARENT SEALING MEMBER HAVING AT LEAST ONE CORNER PORTION IN CURVED SHAPE AND METHOD FOR MANUFACTURING SAME

CROSS-REFERENCE TO RELATED APPLICATIONS

This application is a Continuation of International Application No. PCT/JP2018/013303 filed on Mar. 29, 2018, which is based upon and claims the benefit of priority from International Application No. PCT/JP2017/023547 filed on Jun. 27, 2017, the contents all of which are incorporated herein by reference.

TECHNICAL FIELD

The present invention relates to a transparent sealing member which is used for optical components such as LEDs (light emitting diodes), LDs (semiconductor lasers), or the like, as well as to a method for manufacturing such a transparent sealing member.

BACKGROUND ART

Generally, with an optical component having an optical element (for example, an LED, an LD, or the like) that emits ultraviolet light, a transparent sealing member is required in order to protect the optical element from the open air and moisture. From the standpoints of permeability to ultraviolet rays and durability, glass or quartz glass is preferably used as the transparent sealing member.

In Japanese Patent No. 5243806, a transparent sealing member is disclosed in which a translucent plate material and a hemispherical lens are formed together in an integrated manner. In Japanese Laid-Open Patent Publication No. 10-233532, a transparent sealing member is disclosed in which a translucent chip accommodating member and a hemispherical lens are formed together in an integrated manner.

SUMMARY OF INVENTION

Incidentally, quartz glass has a coefficient of thermal expansion that is smaller than that of $Al_2O_3$ (alumina) or AlN (aluminum nitride), which makes up a constituent material of a mounting substrate. Therefore, when the transparent sealing member is fixed by brazing onto the mounting substrate, or at a time of usage of the optical element, cracks may occur in the transparent sealing member.

Further, since the optical component is of a minute size, when a transparent sealing member having a cavity structure is installed on a mounting substrate, if a displacement in the disposed location thereof occurs, there is a concern that a rectangular portion of the transparent sealing member may press on a bonding wire or a lead frame of the optical element, and a disconnection could be made to occur.

In the case that the mounting substrate has such a cavity structure, when the transparent sealing member is mounted thereon, if a displacement in the disposed location thereof occurs, or if the transparent sealing member is obliquely displaced in position, there is a concern that the transparent sealing member may not be fitted in a prescribed manner onto the mounting substrate, thus resulting in a failure.

Further, if an external impact occurs within the usage environment, there are cases in which cracks occur in the transparent sealing member of the optical component.

The present invention has been devised in consideration of the aforementioned problems, and has the object of providing a transparent sealing member which, when the transparent sealing member is mounted, or alternatively at a time of operation thereof, is capable of suppressing the occurrence of cracks that are generated due to differences in thermal expansion between the mounting substrate and the transparent sealing member, while also being capable of suppressing the occurrence of a failure due to a disconnection or a fitting deviation when the transparent sealing member is mounted.

Further, the present invention has the object of providing a method of manufacturing a transparent sealing member, in which the transparent sealing member, which is of a complex shape having curved corner portions, lens bodies, and the like, can be manufactured without causing generation of chipping or scratches therein, and the manufacturing yield of such transparent sealing members can be improved.

[1] A transparent sealing member according to a first aspect of the present invention is configured to be used for a package in which at least one optical element is accommodated, and is mounted on a mounting substrate having a mounting surface for the optical element, wherein the transparent sealing member includes a plurality of corner portions constituted by surfaces facing toward the mounting substrate, and surfaces extending along the mounting surface of the mounting substrate; among the plurality of corner portions, at least one corner portion has a curved shape; point-shaped minute recesses are formed on a surface of the curved shape; and an average existence frequency of the minute recesses is greater than or equal to 100,000 and less than or equal to 3 million per 1 $mm^2$.

In accordance with these features, when the transparent sealing member is mounted, or alternatively at a time of operation thereof, the transparent sealing member is capable of suppressing the occurrence of cracks that are generated due to differences in thermal expansion between the mounting substrate and the transparent sealing member, while also being capable of suppressing the occurrence of a failure due to a disconnection or a fitting deviation when the transparent sealing member is mounted. Further, even if there is an external impact within the usage environment thereof, it is possible to suppress the occurrence of cracks in the transparent sealing member.

In addition, in the case that the curved shape is formed with a smooth surface without having the minute recesses, if the curved shape becomes damaged due to external factors, stresses are concentrated on the damaged portion, and cracks are likely to be generated therein. In contrast thereto, with the above-described transparent sealing member, since granular minute recesses are formed in the curved shape, even in the case that the curved shape becomes damaged due to external factors, stresses are not concentrated thereon. As a result, cracks can be prevented from being developed in the transparent sealing member. Furthermore, since the granular minute recesses do not possess directionality, there is no direction serving as a starting point at which cracks are likely to begin occurring, and durability is superior.

[2] In the first aspect of the present invention, the surface roughness Ra of the curved shape having the minute recesses may range from 0.01 μm to 0.05 μm.

[3] In the first aspect of the present invention, the transparent sealing member may be used for the package provided with a concave portion in which the optical element is mounted on the mounting substrate, the transparent sealing member may integrally include a lid configured to close the concave portion, and a lens body that bulges from the lid, and the corner portion having the curved shape may be constituted by a side surface of the lens body, and a peripheral surface of the lid that surrounds a bottom portion of the lens body.

When an optical component is manufactured by brazing and bonding the transparent sealing member onto the mounting substrate, the temperature thereof becomes greater than or equal to 200° C. Ordinarily, the transparent sealing member is made of quartz glass or the like, which has a smaller coefficient of thermal expansion than the mounting substrate. For this reason, in a cooling process after having been heated by brazing, tensile stresses are generated in the corner portion of the transparent sealing member, and cracks are likely to be generated therein. Thus, by forming the above-described corner portion of the transparent sealing member in a curved shape, concentration of stresses can be suppressed, and the occurrence of cracking can be prevented.

[4] In the first aspect of the present invention, the transparent sealing member may be used for the package provided with a concave portion in which the optical element is mounted on the mounting substrate, and further provided with a step on the concave portion, the transparent sealing member may integrally include a lid configured to close the concave portion, and a lens body that bulges from the lid, and another corner portion having the curved shape may be constituted by a side surface of the lid, and a surface of the lid that faces toward the mounting substrate.

When the transparent sealing member is placed on the mounting substrate, for example, in the case that the step is formed in the mounting substrate, and the transparent sealing member is mounted (fitted, etc.) into a space surrounded by the step, there is a problem where improper fitting of the transparent sealing member may occur, and the manufacturing yield cannot be improved. Further, when the transparent sealing member is placed on the mounting substrate, the corner portion of the transparent sealing member may hit against the mounting substrate. In particular, when the corner portion of the transparent sealing member is angular, there is a concern that the corner portion may become chipped, and cracks may occur in the transparent sealing member. However, according to the present invention, since the above-described corner portion is of a curved shape, it is possible to reduce the occurrence of a fitting failure such as described above, while in addition, the occurrence of chipping of the corner portion, or generation of cracks in the transparent sealing member can be suppressed. As a result, in the case of being used for an optical component, the manufacturing yield of such an optical component can be improved.

[5] In the first aspect of the present invention, the transparent sealing member may be used for the package provided with a concave portion in which the optical element is mounted on the mounting substrate, and further provided with a step on the concave portion, the transparent sealing member may be constituted by a lens body mounted on the step, and which covers the concave portion, and the corner portion having the curved shape may be constituted by a side surface of the lens body, and a bottom surface of the lens body.

When the lens body is mounted on the mounting substrate, due to a misalignment in positioning, the corner portion of the lens body may hit against the mounting substrate. In such a case, if the corner portion is angulate, there is a concern that the corner portion may become chipped, and cracks may be developed in the lens body. The same problem arises when a step is formed on the mounting substrate, and the lens body is mounted (fitted, etc.) into a space surrounded by the step. However, according to the present invention, since the above-described corner portion is of a curved shape, it is possible to suppress the occurrence of chipping of the corner portion as mentioned above, while in addition, the occurrence of chipping or the like of the lens body can be suppressed, and in the case of being used for an optical component, the manufacturing yield thereof can be improved.

[6] In the first aspect of the present invention, the transparent sealing member may include a concave portion surrounding the optical element that is mounted on the mounting surface of the mounting substrate, and the corner portion having the curved shape may be constituted by an inner peripheral surface of the concave portion, and a bottom surface of the concave portion that faces toward the optical element.

When the optical element is turned on, the optical element generates heat on the order of 100 to 200° C. Since the transparent sealing member which is made of quartz glass has a smaller coefficient of thermal expansion than the mounting substrate, at the time that the optical element is turned on, within the transparent sealing member, tensile stresses are generated in the corner portion that is constituted by the inner peripheral surface of the concave portion and the bottom surface of the concave portion that faces toward the optical element, and cracks are likely to be generated therein. However, according to the present invention, since the above-described corner portion is formed with a curved shape, concentration of stresses in the manner described above can be suppressed, and the occurrence of cracking can be prevented.

[7] In the first aspect of the present invention, the transparent sealing member may include a concave portion surrounding the optical element that is mounted on the mounting surface of the mounting substrate, and the corner portion having the curved shape may be constituted by an inner peripheral surface of the concave portion, and a surface of the transparent sealing member that is attached to the mounting substrate.

Each of the optical element, the mounting substrate, and the transparent sealing member is a minute member, and when the transparent sealing member is installed on the mounting substrate on which the optical element has been mounted, the arrangement and positioning of the transparent sealing member may be shifted. When this occurs, if the transparent sealing member comes into contact with a bonding wire, there is a concern that the wire may become disconnected and result in a failure. In the present invention, since the corner portion, which is constituted by the inner peripheral surface of the concave portion of the transparent sealing member and the surface of the transparent sealing member that is mounted on the mounting substrate, is of a curved shape, even if the transparent sealing member comes into contact with a bonding wire, the probability of a disconnection can be lowered, and the manufacturing yield can be improved.

[8] In the first aspect of the present invention, the corner portion, which is constituted by an outer peripheral surface of the transparent sealing member and an upper surface of the transparent sealing member, may be formed in a curved shape. In accordance with this feature, chipping of the corner portion at a time of conveyance of the transparent sealing member or the like, and the occurrence of cracks or the like in the transparent sealing member can be suppressed.

[9] In the first aspect of the present invention, a radius of curvature of the corner portion having the curved shape is preferably greater than or equal to 5 μm and less than or equal to 500 μm.

The radius of curvature of the corner portion is preferably greater than or equal to 150 μm and less than or equal to 500 μm, and more preferably, is greater than or equal to 300 μm and less than or equal to 500 μm. If the radius of curvature of the corner portion is greater than 500 μm, it is not preferable, because the optical properties are adversely affected, for example, the condensing effect of the lens is reduced.

[10] In the first aspect of the present invention, the constituent material of the transparent sealing member is preferably quartz glass.

[11] In a method of manufacturing a transparent sealing member according to a second aspect of the present invention, the transparent sealing member according to the aforementioned first aspect of the present invention is manufactured by a powder sintering method.

Although it may be considered to manufacture the transparent sealing member by machining, manufacturing in this manner is problematic in that, with such a machining process, chipping or scratches are likely to occur. Even if manufacturing were possible, due to such chipping or scratching, the aforementioned advantageous effects could not be exhibited. Thus, by manufacturing the transparent sealing member using a powder sintering method, the transparent sealing member, which is of a complex shape having curved corner portions, lens bodies, and the like, can be manufactured without causing generation of chipping or scratches therein, and the manufacturing yield of such transparent sealing members can be improved. In addition, the aforementioned advantageous effects can be exhibited.

As has been described above, with the transparent sealing member according to the present invention, when the transparent sealing member is mounted, or alternatively at a time of operation thereof, the transparent sealing member is capable of suppressing the occurrence of cracks that are generated due to differences in thermal expansion between the mounting substrate and the transparent sealing member, while also being capable of suppressing the occurrence of a failure due to a disconnection or a fitting deviation when the transparent sealing member is mounted.

Further, by providing the method of manufacturing the transparent sealing member according to the present invention, the transparent sealing member, which is of a complex shape having curved corner portions, lens bodies, and the like, can be manufactured without causing generation of chipping or scratches therein, and the manufacturing yield of such transparent sealing members can be improved.

BRIEF DESCRIPTION OF DRAWINGS

FIG. 9 is a Table 1 showing evaluation results of Exemplary Embodiments 1 to 3 and Comparative Examples 1 to 3;

FIG. 10 is a Table 3 showing evaluation results of Exemplary Embodiments 7 to 9 and Comparative Examples 5 to 7; and FIG. 11 is a Table 5 showing evaluation results of Exemplary Embodiments 13 to 15 and Comparative Examples 9 to 11.

DESCRIPTION OF EMBODIMENTS

Embodiments of a transparent sealing member and a method of manufacturing the same according to the present invention will be described below with reference to FIGS. 1A to 8B.

Figure 1A:
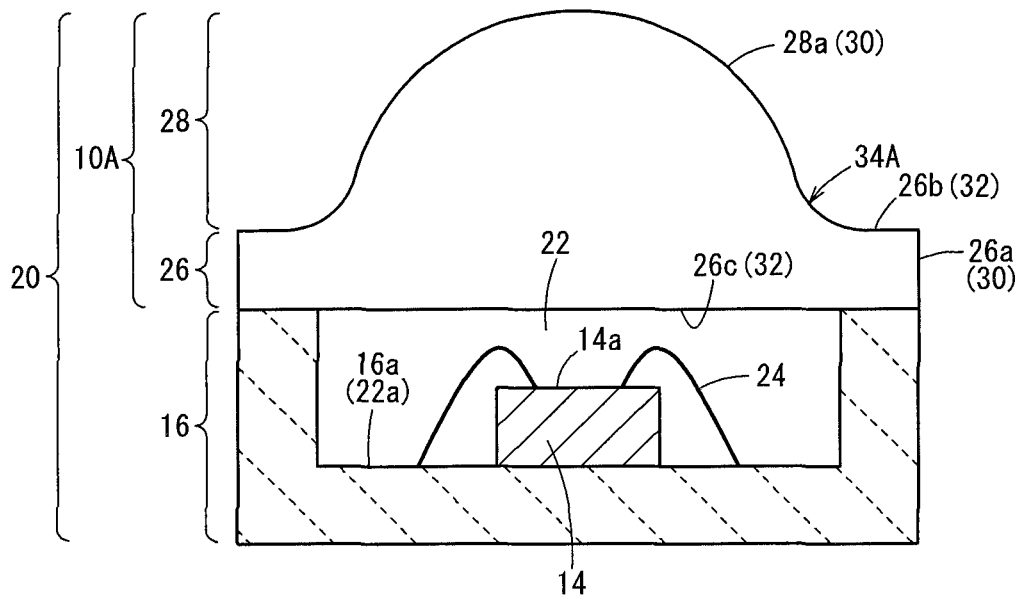
FIG. 1A is a vertical cross-sectional view with partial omission showing an optical component having a transparent sealing member (first transparent sealing member) according to a first embodiment.

First, as shown in FIG. 1A, a transparent sealing member according to a first embodiment (hereinafter referred to as a first transparent sealing member 10A) is used for an optical component 18 having at least one optical element 14 that emits, for example, ultraviolet light, and a mounting substrate 16 on which the optical element 14 is mounted, and the transparent sealing member in cooperation with the mounting substrate 16 constitutes a package 20, in which the optical element 14 is accommodated. The first transparent sealing member 10A is made of, for example, quartz glass, and the mounting substrate 16 is made of, for example, AlN (aluminum nitride). The first transparent sealing member 10A is fixed on the mounting substrate 16, for example, by brazing. It should be noted that, in FIGS. 1A to 8B, illustration of the brazed portion is omitted.

The mounting substrate 16 includes a concave portion 22 in which the optical element 14 is mounted. More specifically, the concave portion 22 constitutes an accommodating space for the optical element 14, and a bottom surface 22a of the concave portion 22 also serves as a mounting surface 16a for the optical element 14.

The optical element 14 is mounted on the mounting surface 16a of the mounting substrate 16. Although not illustrated, the optical element 14 is configured, for example, by laminating GaN-based crystalline layers having a quantum well structure on a sapphire substrate (coefficient of thermal expansion: $7.7 \times 10^{-6}/°C$.). As a method of mounting the optical element 14, a so-called face-up mounting method is adopted in which the optical element is mounted with the light emitting surface 14a being faced toward the first transparent sealing member 10A. More specifically, terminals (not shown) that are led out from the optical element 14, and circuit wirings (not shown) that are formed on the mounting substrate 16 are electrically connected by bonding wires 24.

The first transparent sealing member 10A integrally comprises a lid 26 that closes the concave portion 22 of the mounting substrate 16, and a lens body 28 that bulges from the lid 26. The exterior shape of the lens body 28 is formed, for example, in a dome shape having a hemispherical or bun-like shape (bun-shaped).

In addition, in the first transparent sealing member 10A, as examples of the surfaces 30 that face toward the mounting substrate 16, there may be cited a side surface 28a of the lens body 28, a side surface 26a of the lid 26, and the like. As examples of surfaces 32 extending along the mounting surface 16a of the mounting substrate 16, there may be cited a peripheral surface 26b of the lid 26 that surrounds a bottom portion of the lens body 28, a bottom surface 26c of the lid 26, and the like.

In particular, in the first transparent sealing member 10A, a first corner portion 34A, which is constituted by the side surface 28a of the lens body 28, and the peripheral surface 26b of the lid 26 that surrounds the bottom portion of the lens body 28, is formed in a curved shape.

Moreover, a planar shape of the bottom portion of the lens body 28 (a boundary between the lens body 28 and the lid 26), for example, is of a circular shape, and the exterior shape of the lid 26, for example, is of a square shape. Of course, the planar shape of the bottom portion of the lens body 28 may be an elliptical shape, a track shape, or the like, and the exterior shape of the lid 26 may be a circular shape, or a polygonal shape such as a rectangular shape, a triangular shape, a hexagonal shape, or the like.

As a method of manufacturing the first transparent sealing member 10A having such a shape, preferably, a powder sintering method can be employed. For example, a molding slurry containing silica powder having an average particle size of 0.5 μm and an organic compound is cast into a forming mold and solidified by a chemical reaction mutually with the organic compound, for example, a chemical reaction between a dispersion medium and a curing agent or mutually with the curing agent, and thereafter, the solidified product is released from the mold. Thereafter, the first transparent sealing member 10A can be manufactured by calcinating at 500° C. in the atmosphere, and then firing at 1600 to 1700° C. in a hydrogen atmosphere.

Concerning the dimensions of the first transparent sealing member 10A, the height of the first transparent sealing member 10A is 0.5 to 10 mm, the outer diameter of the lid 26 is 2.0 to 10 mm, and the height of the lid 26 is 0.2 to 1 mm. Concerning the dimensions of the lens body 28, a maximum length of the bottom portion of the lens body 28 may be 2.0 to 10 mm, a maximum height of the lens body 28 may be 0.5 to 10 mm, and an aspect ratio thereof (maximum height/maximum length of the bottom portion) may be 0.3 to 1.0.

Further, concerning the dimensions of the optical element 14, a thickness thereof is 0.005 to 0.5 mm, and although not shown, as viewed from the top, a vertical dimension is 0.5 to 2.0 mm, and a horizontal dimension is 0.5 to 2.0 mm.

Figure 2:
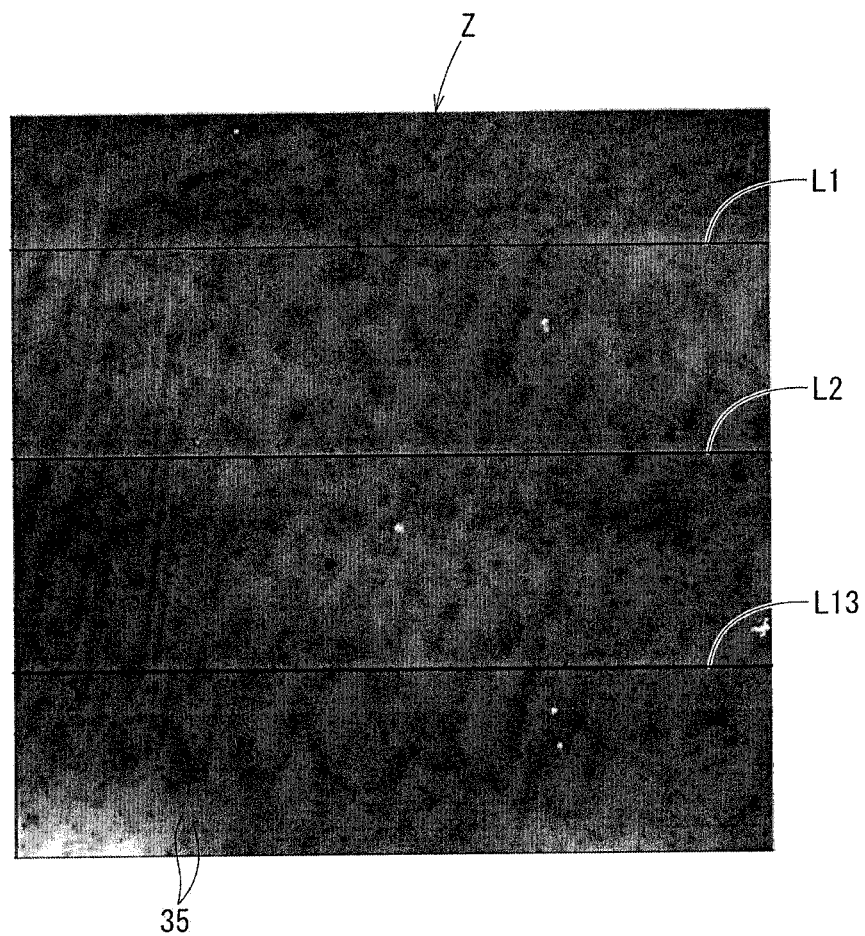
FIG. 2 is a photomicrograph of minute recesses formed on a surface of the transparent sealing member.

On the surface of the first transparent sealing member 10A including the curved shape of the first corner portion 34A produced by the above-described method, point-like (point-shaped) minute recesses 35 are formed thereon, as shown in FIG. 2. The average width of the minute recesses 35 as measured by AFM (atomic force microscopy) is on the order of 0.1 to 2.0 μm, and the depth is on the order of 5 to 50 nm. The average existence frequency of the minute recesses 35 is greater than or equal to 100,000 and less than or equal to 3 million per 1 $mm^2$. Further, the surface roughness Ra of the surface on which the minute recesses 35 are formed is 0.01 to 0.05 μm. Such minute recesses 35 are small in size, and thus do not adversely affect the transparency of the first transparent sealing member 10A.

Moreover, the average width W of the minute recesses 35 can be determined by measuring widths indicated, for example, by the following items (A), (B) or the like, for a plurality of the minute recesses 35 taken as measurement targets, and then dividing the sum total of the measured widths by the number of the minute recesses 35 that were measured.

Figure 3A:
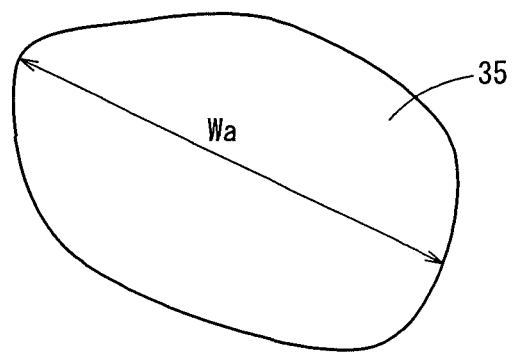
FIG. 3A is an explanatory diagram showing an example of a maximum width of an opening of a minute recess formed on the surface of the transparent sealing member.

(A) The maximum width Wa at the opening of each of the minute recesses 35 (see FIG. 3A).

Figure 3B:
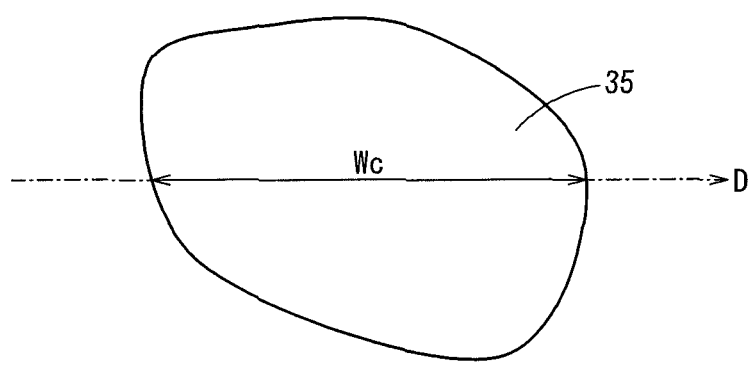
FIG. 3B is an explanatory diagram showing an example of a width in a specified direction that is set beforehand in the opening of the minute recess.

(B) A width We in a predetermined specified direction D at the opening of each of the minute recesses 35 (see FIG. 3B).

Further, the average depth H of the minute recesses 35 can be determined by measuring depths indicated, for example, by the following items (a), (b) or the like, for a plurality of the minute recesses 35 taken as measurement targets, and then dividing the sum total of the measured depths by the number of the minute recesses 35 that were measured.

Figure 4A:
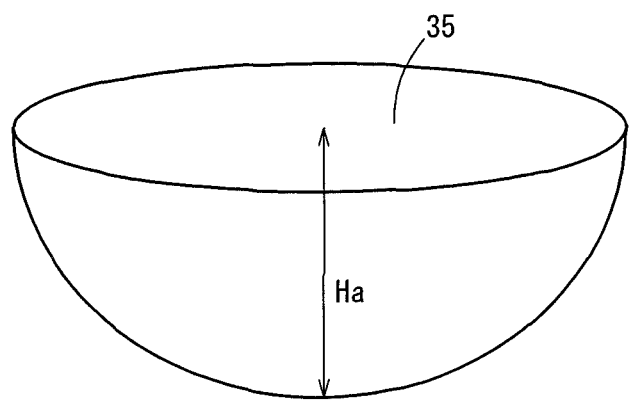
FIG. 4A is an explanatory diagram showing an example of a maximum depth of the minute recess.

(a) The maximum depth Ha of each of the minute recesses 35 (see FIG. 4A).

Figure 4B:
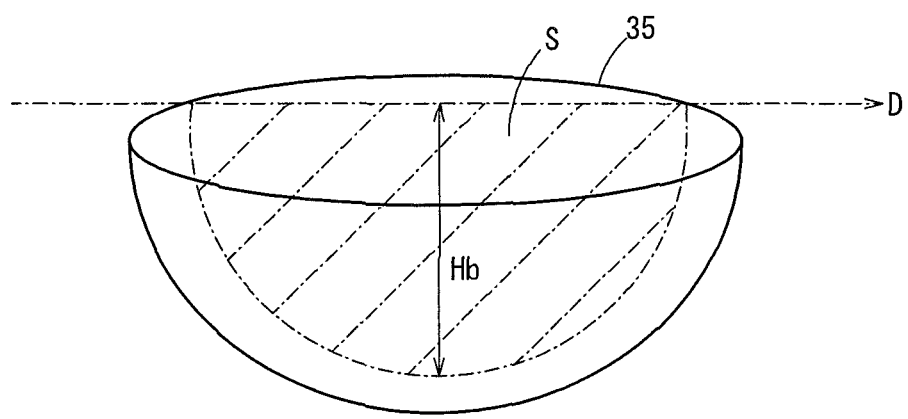
FIG. 4B is an explanatory diagram showing an example of a maximum depth of a plane that is obtained by cutting the minute recess along a predetermined specified direction.

(b) The maximum depth Hb of a surface S obtained by cutting each of the minute recesses along the predetermined specified direction D (see FIG. 4B).

In accordance with such a configuration, the first transparent sealing member 10A exhibits the following actions and effects. More specifically, when the optical component 18 is manufactured by brazing and bonding the first transparent sealing member 10A onto the mounting substrate 16, the temperature thereof becomes greater than or equal to 200° C. Ordinarily, the first transparent sealing member 10A has a smaller coefficient of thermal expansion than the mounting substrate 16. For example, in the case that quartz glass is used as the constituent material of the first transparent sealing member 10A, and $Al_2O_3$ (alumina) and AlN (aluminum nitride) are used as the constituent materials of the mounting substrate 16, the coefficient of thermal expansion of quartz glass is 0.5 to $0.6 \times 10^{-6}/°C$., the coefficient of thermal expansion of $Al_2O_3$ is $7 \times 10^{-6}/°C$., and the coefficient of thermal expansion of AlN is $4.6 \times 10^{-6}/°C$.

Therefore, in a cooling process after having been heated by brazing, tensile stresses are generated in the corner portion (a boundary between the lens body 28 and the lid 26) of the lens body 28, and cracks are likely to be generated therein. However, in the first transparent sealing member 10A, the first corner portion 34A, which is constituted by the side surface 28a of the lens body 28, and the peripheral surface 26b of the lid 26 that surrounds the bottom portion of the lens body 28, is formed in a curved shape. Therefore, concentration of stresses can be suppressed, and the occurrence of cracking can be prevented.

In the case that the curved shape of the first corner portion 34A is formed with a smooth surface without having the minute recesses 35, if the curved shape becomes damaged due to external factors, stresses are concentrated on the damaged portion, and cracks are likely to be generated therein. In contrast thereto, since the granular minute recesses 35 are formed in the curved shape of the first corner portion 34A, even in the case that the curved shape becomes damaged due to external factors, stresses are not concentrated on the damaged portion. As a result, cracks can be prevented from occurring in the first transparent sealing member 10A. Further, since the granular minute recesses 35 do not possess directionality, unlike linear recesses formed by a machining process such as polishing or the like, there is no direction in which cracks are likely to occur, and durability is more superior than with recesses formed by machining.

Figure 1B:
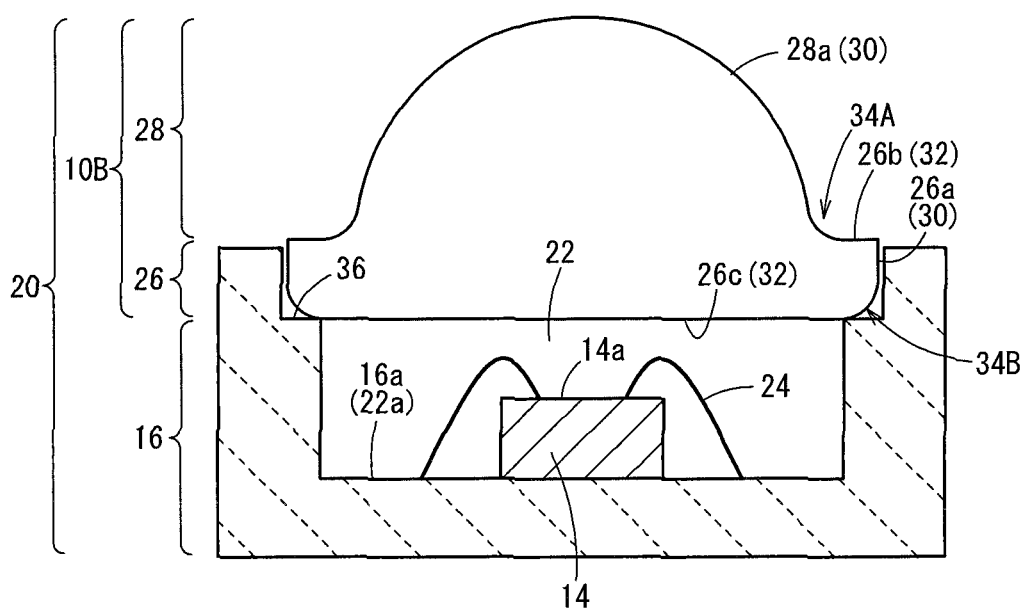
FIG. 1B is a vertical cross-sectional view with partial omission showing an optical component having a transparent sealing member (second transparent sealing member) according to a second embodiment.

Next, as shown in FIG. 1B, a transparent sealing member according to a second embodiment (hereinafter referred to as a second transparent sealing member 10B) has substantially the same configuration as the first transparent sealing member 10A described above, but differs therefrom in the following points.

First, the mounting substrate 16 includes a step 36 on which the second transparent sealing member 10B is mounted. The step 36 is formed in an opening of the concave portion 22 within the mounting substrate 16. Furthermore, in addition to the first corner portion 34A, a second corner portion 34B, which is constituted by the side surface 26a of the lid 26 and the bottom surface 26c of the lid 26, is formed in a curved shape.

In accordance with such a configuration, the second transparent sealing member 10B exhibits the following actions and effects. More specifically, ordinarily, when the transparent sealing member is mounted on the mounting substrate 16, due to a misalignment in positioning, the corner portion of the transparent sealing member may hit against the mounting substrate 16. In such a case, if the corner portion is angulate, there is a concern that the corner portion may become chipped, and cracks may be developed into the lens body 28. The same problem also arises when the step 36 is formed on the mounting substrate 16, and the transparent sealing member is mounted (fitted, etc.) into a space surrounded by the step 36.

However, with the second transparent sealing member 10B, since the second corner portion 34B is formed in a curved shape, when the second transparent sealing member 10B is mounted, and more specifically, when it is fitted onto the step 36 of the mounting substrate 16, the occurrence of chipping of the corner portion, or generation of cracks in the transparent sealing member can be suppressed. Consequently, in the case that the second transparent sealing member 10B is used for the optical component 18, the manufacturing yield of such an optical component 18 can be improved.

Further, the second transparent sealing member 10B exhibits the following actions and effects. More specifically, each of the optical element 14, the mounting substrate 16, and the second transparent sealing member 10B is a minute member, and the positioning thereof may be shifted at a time of installation. For example, when the second transparent sealing member 10B having the lens body 28 is mounted on the step 36 that is formed in the mounting substrate 16, if the positioning of the second transparent sealing member 10B is shifted, or the second transparent sealing member is arranged in an oblique manner, the second transparent sealing member 10B cannot be mounted on the step 36, and a failure may occur. However, with the second transparent sealing member 10B, since the second corner portion 34B is formed in a curved shape, the second transparent sealing member 10B is easily mounted on the step 36 of the mounting substrate 16, and there is an advantageous effect in that the manufacturing yield can be improved.

Moreover, although not illustrated, in the first transparent sealing member 10A and the second transparent sealing member 10B described above, the corner portion, which is constituted by the side surface 26a of the lid 26, and the peripheral surface 26b of the lid 26 that surrounds the bottom portion of the lens body 28, may also be formed in a curved shape. Chipping of such corner portions, and the occurrence of cracks or the like in the lens body 28 at a time of conveyance of the lens body 28 can be suppressed.

Figure 5:
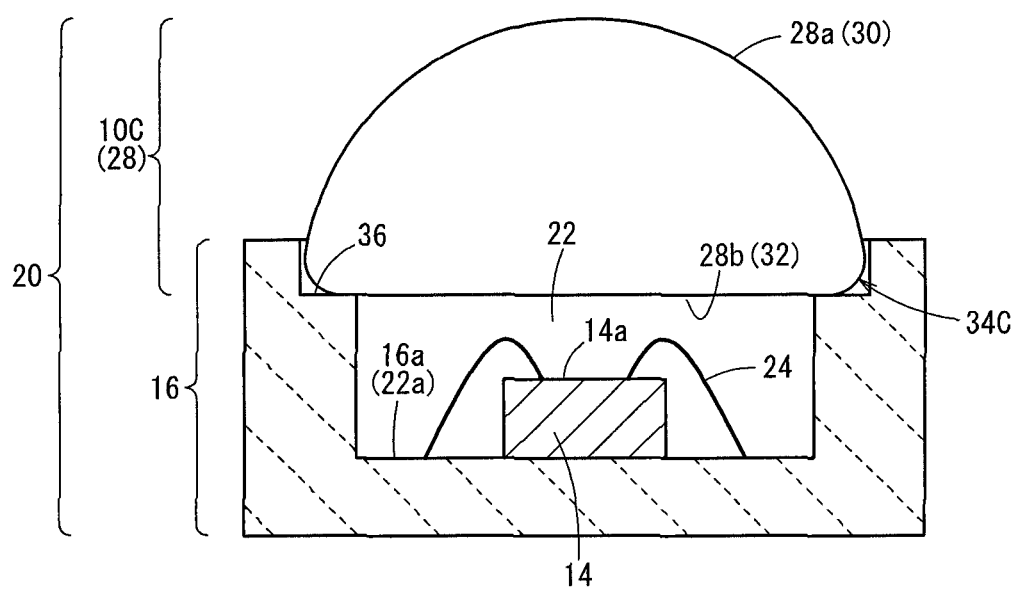
FIG. 5 is a vertical cross-sectional view with partial omission showing an optical component having a transparent sealing member (third transparent sealing member) according to a third embodiment.

Next, a transparent sealing member according to a third embodiment (hereinafter referred to as a third transparent sealing member 10C) has substantially the same configuration as the first transparent sealing member 10A described above, but differs therefrom in that, as shown in FIG. 5, it is constituted only by the lens body 28 that closes the concave portion 22, and a third corner portion 34C, which is constituted by the side surface 28a of the lens body 28 and the bottom surface 28b of the lens body 28, is formed in a curved shape. On the other hand, the mounting substrate 16 includes the step 36 on which the lens body 28 is mounted. The step 36 is formed in an opening of the concave portion 22 within the mounting substrate 16.

In accordance with such a configuration, the third transparent sealing member 10C exhibits the following actions and effects. More specifically, each of the optical element 14, the mounting substrate 16, and the lens body 28 is a minute member, and the positioning thereof may be shifted at a time of installation. For example, when the lens body 28 of a hemispherical shape or the like is mounted on the step 36 that is formed in the mounting substrate 16, if the positioning of the lens body 28 is shifted, or the lens body is arranged in an oblique manner, the lens body 28 cannot be mounted on the step 36, and a failure may occur. However, in the third transparent sealing member 10C, since the third corner portion 34C, which is constituted by the side surface 28a of the lens body 28 and the bottom surface 28b of the lens body 28, has a curved shape, the lens body 28 is easily mounted on the step 36 of the mounting substrate 16, and there is an advantageous effect in that the manufacturing yield can be improved.

Next, a transparent sealing member according to a fourth embodiment (hereinafter referred to as a fourth transparent sealing member 10D) will be described with reference to FIG. 6A.

The mounting substrate 16 of the package 20 in which the fourth transparent sealing member 10D is used, for example, is of a flat plate shape. On the other hand, the fourth transparent sealing member 10D includes a transparent body 29 in which an exterior shape is formed in a dome shape, for example, such as a cylindrical shape, a polygonal tubular shape, or the like. The transparent body 29 includes a concave portion 38 surrounding the optical element 14 that is mounted on the mounting surface 16a of the mounting substrate 16.

In addition, in the transparent body 29 of the fourth transparent sealing member 10D, a fourth corner portion 34D, which is constituted by an inner peripheral surface 38a of the concave portion 38 and a bottom surface 38b of the concave portion 38 facing toward the optical element 14, is formed in a curved shape.

In accordance with such a configuration, the fourth transparent sealing member 10D exhibits the following actions and effects. More specifically, when the optical element 14 is turned on, the optical element 14 generates heat on the order of 100 to 200° C. Ordinarily, since the dome shaped transparent body 29 which is made of quartz glass or the like has a smaller coefficient of thermal expansion than the mounting substrate 16, at the time that the optical element 14 is turned on, within the transparent body 29, tensile stresses are generated in the corner portion that is constituted by the inner peripheral surface 38a of the concave portion 38 and the bottom surface 38b of the concave portion 38 that faces toward the optical element 14, and cracks are likely to be generated therein. However, in the fourth transparent sealing member 10D, since the fourth corner portion 34D of the transparent body 29 is formed in a curved shape, concentration of stresses in the manner described above can be suppressed, and the occurrence of cracking can be prevented.

Next, a transparent sealing member according to a fifth embodiment (hereinafter referred to as a fifth transparent sealing member 10E) will be described with reference to FIG. 6B.

The fifth transparent sealing member 10E has substantially the same configuration as the fourth transparent sealing member 10D described above, but differs therefrom in that, within the dome shaped transparent body 29, a fifth corner portion 34E, which is constituted by the inner peripheral surface 38a of the concave portion 38 and the surface 29a that is installed on the mounting substrate 16, is formed in a curved shape.

In accordance with such a configuration, the fifth transparent sealing member 10E exhibits the following actions and effects. More specifically, each of the optical element 14, the mounting substrate 16, and the transparent body 29 is a minute member, and when the transparent body 29 is installed on the mounting substrate 16 on which the optical element 14 has been mounted, the arrangement and positioning of the transparent body 29 may be shifted. When this occurs, if the transparent body 29 comes into contact with the bonding wires 24, there is a concern that the bonding wires 24 may become disconnected and result in a failure. However, in the fifth transparent sealing member 10E, since the above-described fifth corner portion 34E of the transparent body 29 is formed in a curved shape, the probability of the transparent body 29 coming into contact with the bonding wires 24 and resulting in a disconnection can be reduced, and the manufacturing yield can be improved.

Figure 7A:
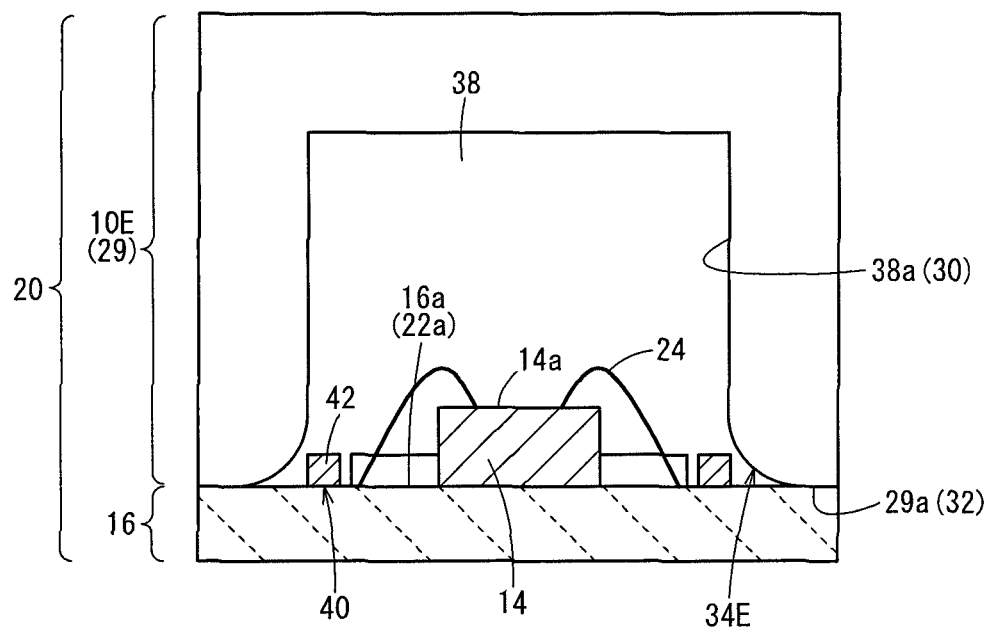
FIG. 7A is a vertical cross-sectional view showing an example in which a positioning protrusion is provided on a mounting substrate in an optical component having the fifth transparent sealing member.
Figure 7B:
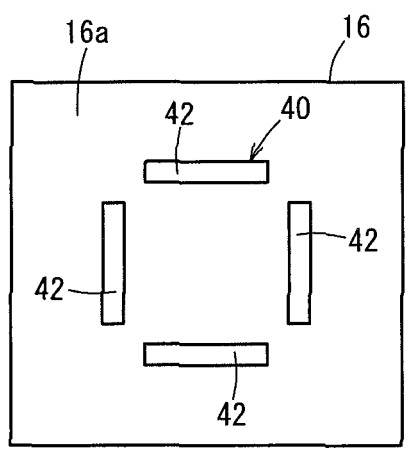
FIG. 7B is a plan view showing an example of the positioning protrusion.
Figure 7C:
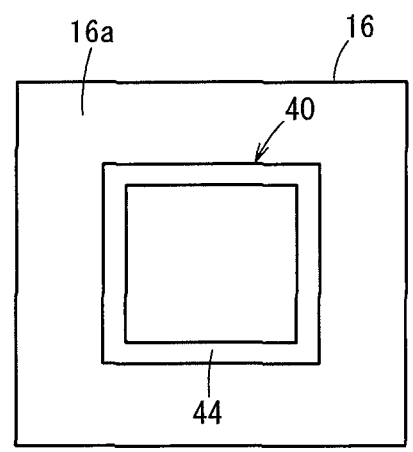
FIG. 7C is a plan view showing another example of the positioning protrusion.

Moreover, as shown in FIG. 7A, a positioning protrusion 40 may be provided on the mounting surface 16a of the mounting substrate 16 integrally with or separately from the mounting substrate 16. As the positioning protrusion 40, a plurality of protrusions 42 may be annularly arranged as shown in FIG. 7B, or a frame-shaped protrusion 44 may be provided as shown in FIG. 7C.

In accordance with this feature, the accuracy with which the transparent body 29 is positioned on the mounting substrate 16 can be increased. In particular, by forming the fifth corner portion 34E of the transparent body 29 in a curved shape, the curvature of the fifth corner portion 34E serves as a guide, and the transparent body 29 can be easily installed on the positioning protrusion 40.

Figure 8A:
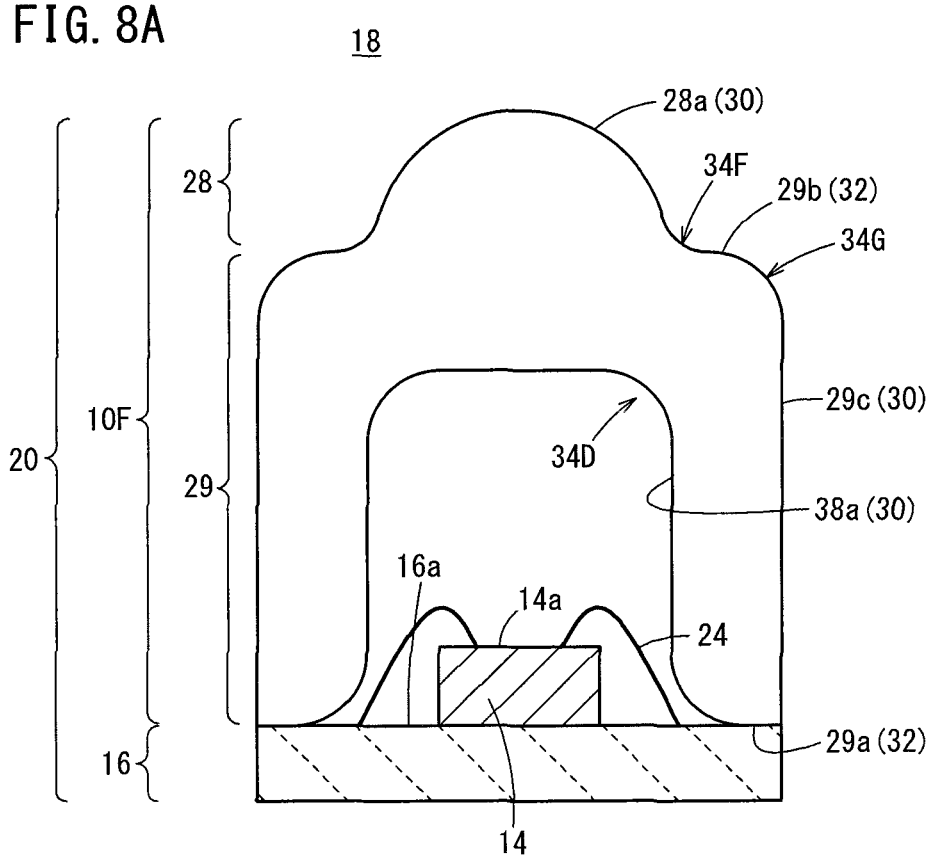
FIG. 8A is a vertical cross-sectional view with partial omission showing an optical component having a transparent sealing member (sixth transparent sealing member) according to a sixth embodiment.

Next, a transparent sealing member according to a sixth embodiment (hereinafter referred to as a sixth transparent sealing member 10F) will be described with reference to FIG. 8A.

The sixth transparent sealing member 10F has substantially the same configuration as the fifth transparent sealing member 10E described above, but has a configuration in which the lens body 28 and the dome shaped transparent body 29 are formed together in an integral manner. More specifically, the sixth transparent sealing member 10F has a configuration in which the lens body 28 is provided on the transparent body 29.

In addition, in the sixth transparent sealing member 10F, a sixth corner portion 34F, which is constituted by the side surface 28a of the lens body 28, and a peripheral surface 29b (which is at once also the upper surface of the transparent body 29) of the dome shaped transparent body 29 that surrounds the bottom portion of the lens body 28, is formed in a curved shape. Further, a seventh corner portion 34G, which is constituted by the peripheral surface 29b surrounding the bottom portion of the lens body 28 and an outer peripheral surface 29c of the transparent body 29, is formed in a curved shape.

Therefore, in a cooling process after completion of brazing and heating, with the sixth transparent sealing member 10F, it is possible to prevent the concentration of stresses on the sixth corner portion 34F, and it is also possible to suppress the occurrence of chipping of the corner portion and generation of cracks in the sixth transparent sealing member 10F at a time of conveyance of the sixth transparent sealing member 10F. In addition, by the seventh corner portion 34G, chipping of the corner portion at a time of conveyance of the sixth transparent sealing member 10F or the like, and the occurrence of cracks or the like in the sixth transparent sealing member 10F can be suppressed.

Next, a transparent sealing member according to a seventh embodiment (hereinafter referred to as a seventh transparent sealing member 10G) will be described with reference to FIG. 8B.

Figure 6A:
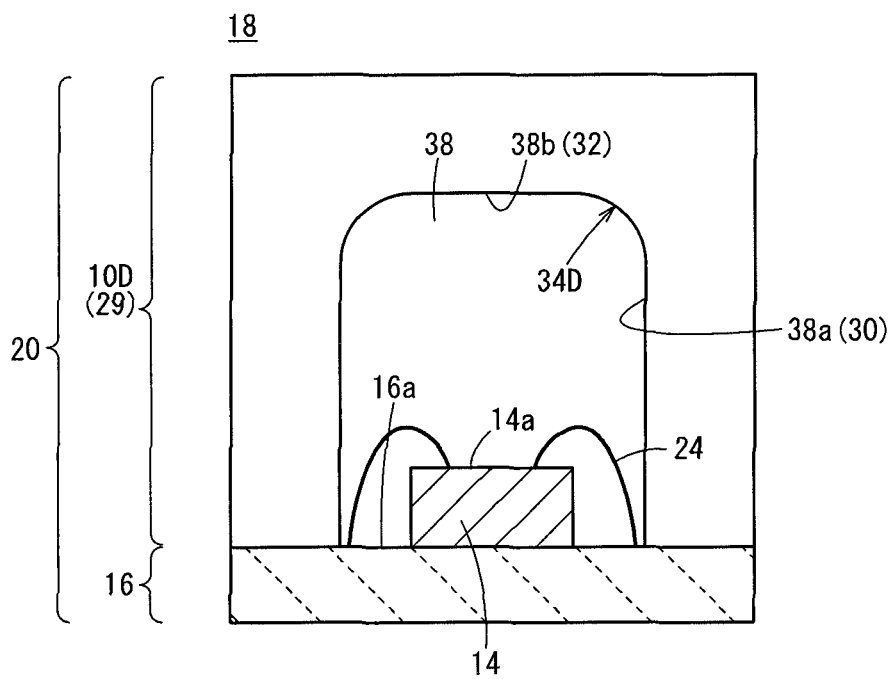
FIG. 6A is a vertical cross-sectional view with partial omission showing an optical component having a transparent sealing member (fourth transparent sealing member) according to a fourth embodiment.
Figure 6B:
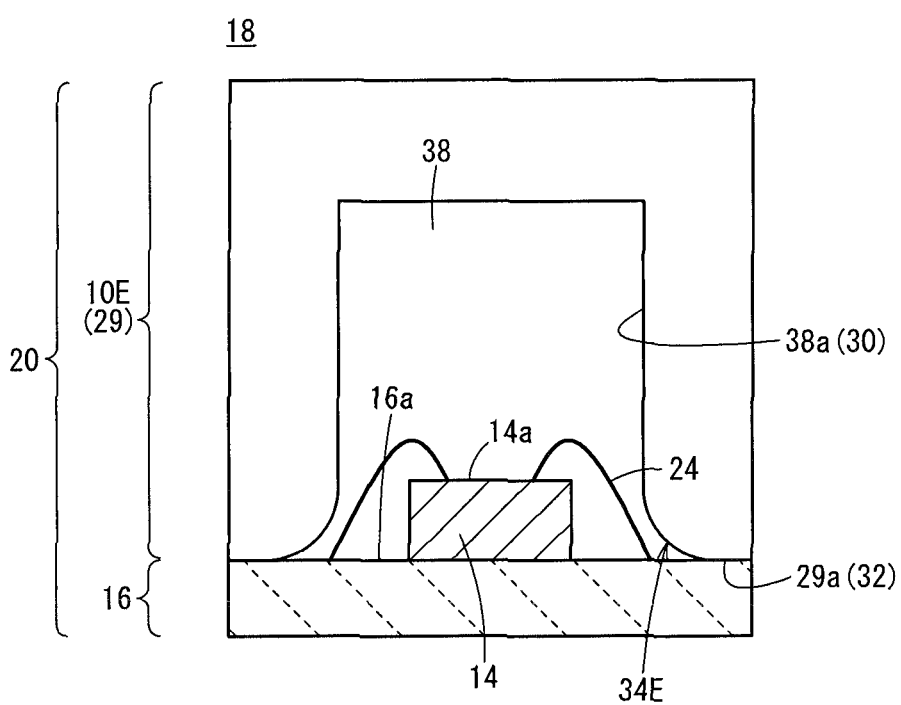
FIG. 6B is a vertical cross-sectional view with partial omission showing an optical component having a transparent sealing member (fifth transparent sealing member) according to a fifth embodiment.

The seventh transparent sealing member 10G includes the transparent body 29 which is similar to that of the above-described fifth transparent sealing member 10E (see FIG. 6B). The transparent body 29 includes a concave portion 38 surrounding the optical element 14 that is mounted on the mounting surface 16a of the mounting substrate 16, and the exterior shape thereof is formed in a dome shape, for example, such as a cylindrical shape, a polygonal tubular shape, or the like.

In addition, in the seventh transparent sealing member 10G, an eighth corner portion 34H, which is constituted by an upper surface 29d of the transparent body 29 and the outer peripheral surface 29c of the transparent body 29, is formed in a curved shape. In accordance with these features, chipping of the corner portion, and the occurrence of cracks or the like in the lens body 28 at a time of conveyance of the lens body 28 can be suppressed.

EXEMPLARY EMBODIMENTS

First Exemplary Embodiment

In the first exemplary embodiment, regarding Exemplary Embodiments 1, 2, and 3 and Comparative Examples 1, 2, and 3, the transparent sealing member 10 was subjected to brazing and bonded onto the mounting substrate 16, and thereafter, after having been cooled, the rate at which cracking is generated in the transparent sealing member 10 was confirmed.

The mounting substrate 16 is made of AlN (aluminum nitride) and has a box shape with an upper surface opening. Both the vertical and horizontal lengths of the mounting substrate 16 were 5.0 mm, and a light emitting diode having an emission wavelength of 280 nm was mounted as the optical element 14 on the mounting surface 16*a*.

Exemplary Embodiment 1

The transparent sealing member 10 according to Exemplary Embodiment 1 has a configuration similar to that of the first transparent sealing member 10A shown in FIG. 1A.

The method of manufacturing the transparent sealing member 10 according to Exemplary Embodiment 1 is as described below. More specifically, a slurry was prepared by mixing 100 parts by mass of a silica powder having an average particle diameter of 0.5 μm as a raw material powder, 2 parts by mass of a carboxylic acid copolymer as a dispersing agent, 49 parts by mass of dimethyl malonate as a dispersing medium, 4 parts by mass of ethylene glycol, 4 parts by mass of 4'4-diphenylmethane diisocyanate as a curing agent, and 0.4 parts by mass of triethylamine as a catalyst.

The slurry was poured into a metal mold at room temperature, and left at room temperature for a fixed time period. Subsequently, the molded body was released from the mold. Furthermore, the molded body was allowed to stand at room temperature, and then at a temperature of 90° C. for a certain period of time to thereby obtain a silica powder molded body. Moreover, the average particle size of the raw material powder was measured using a laser diffraction/scattering particle size distribution measurement apparatus LA-750 manufactured by Horiba, Ltd.

The thus manufactured silica powder molded body was calcined at 500° C. in the atmosphere, and then fired at 1600° C. to 1700° C. in a hydrogen atmosphere, to thereby become densified and be made transparent in order to produce the transparent sealing member 10. Incidentally the above-described mold was processed or machined beforehand such that, in the completed transparent sealing member 10, the first corner portion 34A constituted by the side surface 28*a* of the lens body 28 and the peripheral surface 26*b* of the lid 26 surrounding the bottom portion of the lens body 28, was formed in a curved shape. The vertical and horizontal lengths of the transparent sealing member 10 are both 5.0 mm, the diameter of the bottom surface 28*b* of the lens body 28 is 3 mm, and the height of the lens body 28 is 1.5 mm. The height of the lid 26 is 0.3 mm.

In addition, in Exemplary Embodiment 1, one hundred transparent sealing members 10, in which the radius of curvature of the curved shape formed in the first corner portion 34A was greater than or equal to 5 μm and less than 150 μm, were produced. Thereafter, the one hundred transparent sealing members 10 were respectively brazed and bonded onto one hundred separately prepared mounting substrates 16 (on which light emitting diodes had already been mounted), and one hundred optical components according to Exemplary Embodiment 1 were manufactured.

The aforementioned brazing and bonding was carried out in the following manner. More specifically, a gold and tin plating was applied to the periphery of the bottom surface 26*c* of the transparent sealing member 10, and to a bonding surface of the mounting substrate 16. Thereafter, the transparent sealing member 10 was attached to the mounting substrate 16, heated to 300° C. and bonded thereto, and then allowed to cool.

Exemplary Embodiment 2

A silica powder molded body, which was manufactured by the same manufacturing method as in Exemplary Embodiment 1, was calcined at 500° C. in the atmosphere, and thereafter fired in a hydrogen atmosphere at a temperature 10° C. lower than in Exemplary Embodiment 1, thereby producing the transparent sealing member 10. Stated otherwise, the transparent sealing member 10 of Exemplary Embodiment 2 was manufactured by the same method as in Exemplary Embodiment 1, except that it was fired in the hydrogen atmosphere at a 10° C.-lower firing temperature. In Exemplary Embodiment 2, one hundred transparent sealing members 10, in which the radius of curvature of the curved shape formed in the first corner portion 34A was greater than or equal to 150 μm and less than 300 μm, were produced. Thereafter, one hundred optical components according to Exemplary Embodiment 2 were produced in the same manner as in Exemplary Embodiment 1.

Exemplary Embodiment 3

A silica powder molded body, which was manufactured by the same manufacturing method as in Exemplary Embodiment 1, was calcined at 500° C. in the atmosphere, and thereafter fired in a hydrogen atmosphere at a temperature 20° C. lower than in Exemplary Embodiment 1, thereby producing the transparent sealing member 10. Stated otherwise, the transparent sealing member 10 of Exemplary Embodiment 3 was manufactured by the same method as in Exemplary Embodiment 1, except that it was fired in the hydrogen atmosphere at a 20° C.-lower firing temperature. In Exemplary Embodiment 3, one hundred transparent sealing members 10, in which the radius of curvature of the curved shape formed in the first corner portion 34A was greater than or equal to 300 μm and less than or equal to 500 μm, were produced.

Comparative Example 1

One hundred transparent sealing members 10 were produced by subjecting quartz glass to a grinding process. The configuration of the transparent sealing member 10 according to Comparative Example 1 has substantially the same configuration as that of Exemplary Embodiment 1, but differs in that the first corner portion 34A is not of a curved shape, but rather the boundary between the lens body 28 and the lid 26 is angular. Thereafter, one hundred optical components according to Comparative Example 1 were produced in the same manner as in Exemplary Embodiment 1.

Comparative Example 2

One hundred transparent sealing members 10 were produced by a manufacturing method similar to that of Exemplary Embodiment 1. However, according to Comparative Example 2, lastly, an etching process was performed to thereby smooth the surface thereof. In Comparative Example 2, due to the etching process, the number of minute recesses 35 is smaller than that in Exemplary Embodiment 1.

Comparative Example 3

A silica powder molded body, which was manufactured by the same manufacturing method as in Exemplary Embodiment 1, was calcined at 500° C. in the atmosphere, and thereafter fired in a hydrogen atmosphere at a temperature 190° C. lower than in Exemplary Embodiment 1, thereby producing the transparent sealing member 10. Stated otherwise, the transparent sealing member 10 of Comparative Example 3 was manufactured by the same method as in Exemplary Embodiment 1, except that it was fired in the hydrogen atmosphere at a 190° C.-lower firing temperature. In Comparative Example 3, one hundred transparent sealing members 10, in which the radius of curvature of the curved shape formed in the first corner portion 34A was greater than or equal to 300 μm and less than or equal to 500 μm, were produced.

(Evaluation)

The shape of the minute recesses 35 was evaluated according to the following method. Initially, for each one of the samples, five AFM surface images were obtained using AFM (atomic force microscopy). Next, three line profiles were acquired from each of the AFM surface images, and twenty of the minute recesses 35 were arbitrarily extracted from the line profiles. More specifically, for each one of the samples, (20 individual instance/1 AFM surface image)×5 AFM surface images=100 minute recesses 35 were extracted. Then, for each one of the samples, the average width and the average depth of 100 minute recesses 35 were acquired. In FIG. 2, examples are shown of three lines L1, L2, and L3, for the purpose of acquiring three line profiles with respect to one inspection target region Z of one sample.

Regarding the frequency at which the minute recesses 35 occur, for each one of the samples, five AFM surface images were obtained. Concerning each of the AFM surface images, the number of minute recesses 35 in each of four arbitrarily-set inspection target regions Z was counted, and the respective count values were converted into a number of individual recesses per 1 mm². Then, for each of the samples, the average number of the minute recesses 35 was acquired. Moreover, the size of the inspection target regions Z is from 5 μm to 50 μm square.

The surface roughness Ra was measured using the AFM surface image.

Linear transmittance was measured using a spectrophotometer manufactured by JASCO Corporation. The linear transmittance was measured in regards to ultraviolet light having a wavelength λ of 300 nm.

Regarding the rate at which cracking is generated, the transparent sealing member 10 according to Examples 1, 2, and 3 and Comparative Examples 1, 2, and 3 were subjected to brazing and bonded onto the mounting substrate 16, and thereafter, after having been cooled, the rate at which cracking is generated therein was confirmed. The results thereof are shown in Table 1 of FIG. 9.

In Exemplary Embodiments 1, 2, and 3 and Comparative Examples 1, 2, and 3, the average width, the average depth, and the average existence frequency of the minute recesses 35, along with the surface roughness of the samples, the radius of curvature of the corners, the linear transmittance, and the rate at which cracking is generated are shown in Table 1 of FIG. 9. Moreover, in Table 1 of FIG. 9, since there are no corners in Comparative Example 1, the average existence frequency of the minute recesses 35 is indicated by "-", and the radius of curvature of the corners is assumed to be zero.

From the results shown in Table 1, it can be understood that the radius of curvature of the first corner portion 34A having the curved shape should preferably be greater than or equal to 5 μm and less than or equal to 500 m. More preferably, the radius of curvature should be greater than or equal to 150 μm and less than or equal to 500 μm, and particularly preferably, greater than or equal to 300 μm and less than or equal to 500 μm. If the radius of curvature of the first corner portion 34A is greater than 500 μm, it is not preferable, because the condensing effect of the lens is reduced, and the optical properties are adversely affected.

It can be understood that the average existence frequency of the minute recesses 35 should preferably be greater than or equal to 100,000 and less than or equal to 3 million per 1 mm². Moreover, as shown in Comparative Example 2, it can be understood that if the minute recesses 35 are reduced by being subjected to smoothing by way of etching, the rate at which cracking is generated is worsened. In Comparative Example 2, comparatively large sized minute recesses 35 which cannot be removed by etching remain, and by serving as starting points for cracks, it is considered to worsen the rate at which cracking is generated. Moreover, in Comparative Example 3, due to the fact that the size of the minute recesses 35 is increased, the number of the minute recesses 35 per unit area is reduced.

Further, concerning the surface roughness of the transparent sealing member 10 which has a curved shape, it can be understood that it is preferable for the surface roughness to be greater than or equal to 0.01 μm and less than or equal to 0.05 μm. As shown in Comparative Example 1 and Comparative Example 2, when the surface roughness is less than 0.01 μm, the rate at which cracking is generated increases. Further, as shown in Comparative Example 3, when the surface roughness exceeds 0.05 μm, although the rate at which cracking is generated does not increase, it is not preferable, because the optical properties are adversely affected, such as a decrease in linear transmittance or the like.

Second Exemplary Embodiment

In the second exemplary embodiment, regarding Exemplary Embodiments 4, 5, and 6 and Comparative Example 4, the rate at which defects occurred when the transparent sealing member 10 was mounted on the mounting substrate 16 was confirmed. In this instance, the rate at which defects occurred was taken as a ratio of the number of times that the positioning protrusion 40 does not enter into the concave portion 38 of the transparent sealing member 10, out of the number of times that testing was performed (for example, 100 times), when the transparent sealing member 10 was mounted on the mounting substrate 16 having the positioning protrusion 40 (see FIGS. 7B and 7C) provided on the mounting surface 16a thereof.

Exemplary Embodiment 4

The transparent sealing member 10 according to Exemplary Embodiment 4 has a configuration similar to that of the second transparent sealing member 10B shown in FIG. 1B. Since the method of manufacturing the transparent sealing member 10 according to Exemplary Embodiment 4 is the same as that of the above-described Exemplary Embodiment 1, description thereof is omitted.

In addition, in Exemplary Embodiment 4, one hundred transparent sealing members 10, in which the radius of curvature of the curved shape formed in the second corner portion 34B was greater than or equal to 5 μm and less than 150 μm, were produced. Thereafter, the one hundred transparent sealing members 10 were respectively brazed and bonded onto one hundred separately prepared mounting substrates 16 (on which light emitting diodes had already been mounted), and one hundred optical components according to Exemplary Embodiment 4 were manufactured.

Exemplary Embodiment 5

In Exemplary Embodiment 5, one hundred transparent sealing members 10, in which the radius of curvature of the curved shape formed in the second corner portion 34B was greater than or equal to 150 μm and less than 300 μm, were produced. Thereafter, one hundred optical components according to Exemplary Embodiment 5 were produced in the same manner as in Exemplary Embodiment 4.

Exemplary Embodiment 6

In Exemplary Embodiment 6, one hundred transparent sealing members 10, in which the radius of curvature of the curved shape formed in the second corner portion 34B was greater than or equal to 300 μm and less than or equal to 500 μm, were produced. Thereafter, one hundred optical components according to Exemplary Embodiment 6 were produced in the same manner as in Exemplary Embodiment 4.

Comparative Example 4

One hundred transparent sealing members 10 were produced by subjecting quartz glass to a grinding process. The configuration of the transparent sealing member 10 according to Comparative Example 4 has substantially the same configuration as that of Exemplary Embodiment 4, but differs in that the second corner portion 34B is not of a curved shape, but rather the boundary between the side surface 26a of the lid 26 and the bottom surface 26c of the lid 26 is angular. Thereafter, one hundred optical components according to Comparative Example 4 were produced in the same manner as in Exemplary Embodiment 4.

(Evaluation)

Regarding Exemplary Embodiments 4, 5 and 6 and Comparative Example 4, the rate at which the aforementioned defects occurred was confirmed. The results thereof are shown in the following Table 2.

TABLE 2

| | Second Corner Portion | | |
| --- | --- | --- | --- |
| | Curved Shape | Radius of Curvature (μm) | Rate at which Defects Occurred |
| Exemplary Embodiment 4 | YES | ≥5, <150 | 5/100 |
| Exemplary Embodiment 5 | YES | ≥150, <300 | 2/100 |
| Exemplary Embodiment 6 | YES | ≥300, ≤500 | 0/100 |
| Comparative Example 4 | NO | — | 22/100 |

From the results shown in Table 2, it can be understood that the radius of curvature of the second corner portion 34B having the curved shape should preferably be greater than or equal to 5 μm and less than or equal to 500 μm. More preferably, the radius of curvature should be greater than or equal to 150 μm and less than or equal to 500 μm, and particularly preferably, greater than or equal to 300 μm and less than or equal to 500 μm. If the radius of curvature of the second corner portion 34B is greater than 500 μm, it is not preferable, because the optical properties are adversely affected.

Third Exemplary Embodiment

In the third exemplary embodiment, regarding Exemplary Embodiments 7, 8, and 9 and Comparative Examples 5, 6, and 7, after repeatedly carrying out a cycle of turning on the optical element 14, and thereafter, turning off the optical element, the rate at which cracking is generated in the transparent sealing member 10 was confirmed.

Exemplary Embodiment 7

The transparent sealing member 10 according to Exemplary Embodiment 7 has a configuration similar to that of the fourth transparent sealing member 10D shown in FIG. 6A. Since the method of manufacturing the transparent sealing member 10 according to Exemplary Embodiment 7 is the same as that of the above-described Exemplary Embodiment 1, description thereof is omitted.

In addition, in Exemplary Embodiment 7, one hundred transparent sealing members 10, in which the radius of curvature of the curved shape formed in the fourth corner portion 34D was greater than or equal to 5 μm and less than 150 μm, were produced. Thereafter, the one hundred transparent sealing members 10 were respectively brazed and bonded onto one hundred separately prepared mounting substrates 16 (on which light emitting diodes had already been mounted), and one hundred optical components according to Exemplary Embodiment 7 were manufactured.

Exemplary Embodiment 8

The transparent sealing member 10 was produced by a manufacturing method similar to that of Exemplary Embodiment 7. In Exemplary Embodiment 8, the firing temperature in the hydrogen atmosphere was 10° C. lower than the firing temperature in Exemplary Embodiment 7. Further, one hundred transparent sealing members 10, in which the radius of curvature of the curved shape formed in the fourth corner portion 34D was greater than or equal to 150 μm and less than 300 μm, were produced. Thereafter, one hundred optical components according to Exemplary Embodiment 8 were produced in the same manner as in Exemplary Embodiment 7.

Exemplary Embodiment 9

The transparent sealing member 10 was produced by a manufacturing method similar to that of Exemplary Embodiment 7. In Exemplary Embodiment 9, the firing temperature in the hydrogen atmosphere was 20° C. lower than the firing temperature in Exemplary Embodiment 7. Further, one hundred transparent sealing members 10, in which the radius of curvature of the curved shape formed in the fourth corner portion 34D was greater than or equal to 300 m and less than or equal to 500 μm, were produced. Thereafter, one hundred optical components according to Exemplary Embodiment 9 were produced in the same manner as in Exemplary Embodiment 7.

Comparative Example 5

One hundred transparent sealing members 10 were produced by subjecting quartz glass to a grinding process. The configuration of the transparent sealing member 10 according to Comparative Example 5 has substantially the same configuration as that of Exemplary Embodiment 7, but differs in that the fourth corner portion 34D is not of a curved shape, but rather the boundary between the inner peripheral surface 38a of the concave portion 38 and the bottom surface 38b of the concave portion 38 facing toward the optical element 14 is angular. Thereafter, one hundred optical components according to Comparative Example 5 were produced in the same manner as in Exemplary Embodiment 7.

Comparative Example 6

The transparent sealing member 10 was produced by a manufacturing method similar to that of Exemplary Embodiment 7. In Comparative Example 6, the surface of the transparent sealing member 10 was smoothed by subjecting it to an etching process. Thereafter, one hundred optical components according to Comparative Example 6 were produced in the same manner as in Exemplary Embodiment 7.

Comparative Example 7

The transparent sealing member 10 was produced by a manufacturing method similar to that of Exemplary Embodiment 7. In Comparative Example 7, the firing temperature in the hydrogen atmosphere was 190° C. lower than the firing temperature in Exemplary Embodiment 7. Thereafter, one hundred optical components according to Comparative Example 7 were produced in the same manner as in Exemplary Embodiment 7.
(Evaluation)

Regarding Exemplary Embodiments 7, 8, and 9 and Comparative Examples 5, 6, and 7, the rate at which cracking is generated therein, and more specifically, after repeatedly carrying out a cycle of turning on the optical element 14, and thereafter, turning off the optical element, the rate at which cracking is generated in the transparent sealing member 10 was confirmed. The results thereof are shown in Table 3 of FIG. 10.

From the results shown in Table 3, it can be understood that the radius of curvature of the fourth corner portion 34D having the curved shape should preferably be greater than or equal to 5 µm and less than or equal to 500 µm. More preferably, the radius of curvature should be greater than or equal to 150 µm and less than or equal to 500 µm, and particularly preferably, greater than or equal to 300 µm and less than or equal to 500 µm. If the radius of curvature of the fourth corner portion 34D is greater than 500 µm, it is not preferable, because the volume of the accommodating space is reduced, and the ratio at which the transparent sealing member 10 comes into contact with the bonding wires 24 or the optical element 14 is increased.

The average existence frequency of the minute recesses 35 is greater than or equal to 100,000 and less than or equal to 3 million per 1 mm². Moreover, as shown in Comparative Example 6, it can be understood that if the minute recesses 35 are reduced by being subjected to smoothing by way of etching, the rate at which cracking is generated is worsened. In Comparative Example 6 as well, the comparatively large sized minute recesses 35 which cannot be removed by etching serve as starting points for cracks, whereby it is considered to worsen the rate at which cracking is generated.

Further, concerning the surface roughness of the transparent sealing member 10 which has a curved shape, it can be understood that it is preferable for the surface roughness to be greater than or equal to 0.01 µm and less than or equal to 0.05 µm. As shown in Comparative Example 5 and Comparative Example 6, when the surface roughness is less than 0.01 µm, the rate at which cracking is generated increases. Further, as shown in Comparative Example 7, when the surface roughness exceeds 0.05 µm, although the rate at which cracking is generated does not increase, it is not preferable, because the optical properties are adversely affected, such as a decrease in linear transmittance or the like.

Fourth Exemplary Embodiment

In the fourth exemplary embodiment, regarding Exemplary Embodiments 10, 11, and 12 and Comparative Example 8, the rate at which disconnections occurred when the transparent sealing member 10 was mounted on the mounting substrate 16 was confirmed. In this instance, the meaning of disconnection implies a disconnection of the bonding wires 24 caused by the transparent sealing member 10 coming into contact with the bonding wires 24, due to a misalignment in positioning when the transparent sealing member 10 is mounted on the mounting substrate 16.

Exemplary Embodiment 10

The transparent sealing member 10 according to Exemplary Embodiment 10 has a configuration similar to that of the fifth transparent sealing member 10E shown in FIG. 6B. Since the method of manufacturing the transparent sealing member 10 according to Exemplary Embodiment 10 is the same as that of the above-described Exemplary Embodiment 1, description thereof is omitted.

In addition, in Exemplary Embodiment 10, one hundred transparent sealing members 10, in which the radius of curvature of the curved shape formed in the fifth corner portion 34E was greater than or equal to 5 µm and less than 150 µm, were produced. Thereafter, the one hundred transparent sealing members 10 were respectively brazed and bonded onto one hundred separately prepared mounting substrates 16 (on which light emitting diodes had already been mounted), and one hundred optical components according to Exemplary Embodiment 10 were manufactured.

Exemplary Embodiment 11

The transparent sealing member 10 was produced by a manufacturing method similar to that of Exemplary Embodiment 10. In Exemplary Embodiment 11, one hundred transparent sealing members 10, in which the radius of curvature of the curved shape formed in the fifth corner portion 34E was greater than or equal to 150 µm and less than 300 µm, were produced. Thereafter, one hundred optical components according to Exemplary Embodiment 11 were produced in the same manner as in Exemplary Embodiment 10.

Exemplary Embodiment 12

The transparent sealing member 10 was produced by a manufacturing method similar to that of Exemplary Embodiment 10. In Exemplary Embodiment 12, one hundred transparent sealing members 10, in which the radius of curvature of the curved shape formed in the fifth corner portion 34E was greater than or equal to 300 µm and less than or equal to 500 µm, were produced. Thereafter, one hundred optical components according to Exemplary Embodiment 12 were produced in the same manner as in Exemplary Embodiment 10.

Comparative Example 8

One hundred transparent sealing members 10 were produced by subjecting quartz glass to a grinding process. The configuration of the transparent sealing member 10 according to Comparative Example 8 has substantially the same configuration as that of Exemplary Embodiment 10, but differs in that the fifth corner portion 34E is not of a curved shape, but rather the boundary between the inner peripheral surface 38a of the concave portion 38, and the surface 29a of the transparent sealing member 10 that is attached to the mounting substrate 16 is angular. Thereafter, one hundred optical components according to Comparative Example 8 were produced in the same manner as in Exemplary Embodiment 10.
(Evaluation)

Regarding Exemplary Embodiments 10, 11, and 12 and Comparative Example 8, the rate at which the aforementioned disconnections occurred therein was confirmed. The results thereof are shown in the following Table 4.

TABLE 4

| | Fifth Corner Portion | | |
|---|---|---|---|
| | Curved Shape | Radius of Curvature (μm) | Rate at which Disconnections Occurred |
| Exemplary Embodiment 10 | YES | ≥5, <150 | 4/100 |
| Exemplary Embodiment 11 | YES | ≥150, <300 | 2/100 |
| Exemplary Embodiment 12 | YES | ≥300, ≤500 | 0/100 |
| Comparative Example 8 | NO | — | 25/100 |

From the results shown in Table 4, it can be understood that the radius of curvature of the fifth corner portion 34E having the curved shape should preferably be greater than or equal to 5 μm and less than or equal to 500 μm. More preferably, the radius of curvature should be greater than or equal to 150 μm and less than or equal to 500 μm, and particularly preferably, greater than or equal to 300 μm and less than or equal to 500 μm. If the radius of curvature of the fifth corner portion 34E is greater than 500 μm, it is not preferable, because the contact area between the transparent sealing member 10 and the mounting substrate 16 decreases, and the adhesive strength decreases.

Fifth Exemplary Embodiment

In the fifth exemplary embodiment, regarding Exemplary Embodiments 13, 14, and 15 and Comparative Examples 9, 10, and 11, after having changed the radius of curvature of the eighth corner portion 34H (see FIG. 8B) and thereby manufactured the transparent sealing member 10, a dropping test from a predetermined height was performed, and the rate at which cracking is generated was evaluated.

Exemplary Embodiment 13

Figure 8B:
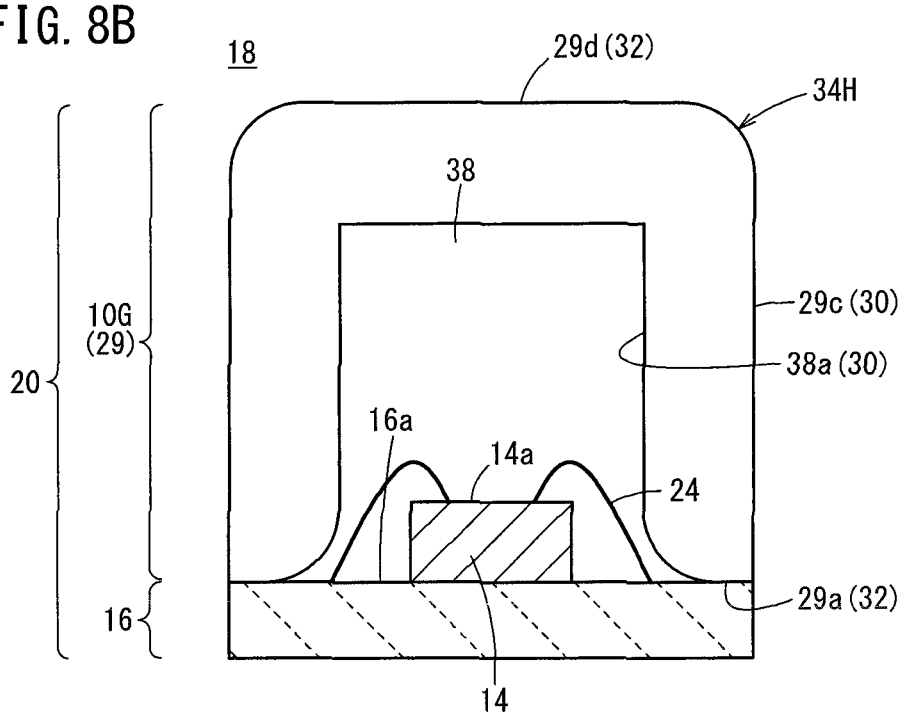
FIG. 8B is a vertical cross-sectional view with partial omission showing an optical component having a transparent sealing member (seventh transparent sealing member) according to a seventh embodiment.

The transparent sealing member 10 according to Exemplary Embodiment 13 has a configuration similar to that of the seventh transparent sealing member 10G shown in FIG. 8B. Since the method of manufacturing the transparent sealing member 10 according to Exemplary Embodiment 13 is the same as that of the above-described Exemplary Embodiment 1, description thereof is omitted. In addition, in Exemplary Embodiment 13, one hundred transparent sealing members 10, in which the radius of curvature of the curved shape formed in the eighth corner portion 34H was greater than or equal to 5 μm and less than 150 μm, were produced.

Exemplary Embodiment 14

The transparent sealing member 10 was produced by a manufacturing method similar to that of Exemplary Embodiment 13. In Exemplary Embodiment 14, the firing temperature in the hydrogen atmosphere was 10° C. lower than the firing temperature in Exemplary Embodiment 13. Further, one hundred transparent sealing members 10, in which the radius of curvature of the curved shape formed in the eighth corner portion 34H was greater than or equal to 150 μm and less than 300 μm, were produced.

Exemplary Embodiment 15

The transparent sealing member 10 was produced by a manufacturing method similar to that of Exemplary Embodiment 13. In Exemplary Embodiment 15, the firing temperature in the hydrogen atmosphere was 20° C. lower than the firing temperature in Exemplary Embodiment 13. Further, one hundred transparent sealing members 10, in which the radius of curvature of the curved shape formed in the eighth corner portion 34H was greater than or equal to 300 m and less than or equal to 500 μm, were produced.

Comparative Example 9

One hundred transparent sealing members 10 were produced by subjecting quartz glass to a grinding process. The configuration of the transparent sealing member 10 according to Comparative Example 9 has substantially the same configuration as that of Exemplary Embodiment 13, but differs in that the eighth corner portion 34H is not of a curved shape, but rather the boundary between the upper surface 29d of the transparent body 29 and the outer peripheral surface 29c of the transparent body 29 is angular.

Comparative Example 10

The transparent sealing member 10 was produced by a manufacturing method similar to that of Exemplary Embodiment 13. In Comparative Example 10, the surface of the transparent sealing member 10 was smoothed by subjecting it to an etching process. Thereafter, one hundred optical components according to Comparative Example 10 were produced in the same manner as in Exemplary Embodiment 13.

Comparative Example 11

The transparent sealing member 10 was produced by a manufacturing method similar to that of Exemplary Embodiment 13. In Comparative Example 11, the firing temperature in the hydrogen atmosphere was 190° C. lower than the firing temperature in Exemplary Embodiment 13. Thereafter, one hundred optical components according to Comparative Example 11 were produced in the same manner as in Exemplary Embodiment 13.

(Evaluation)

Regarding Exemplary Embodiments 13, 14, and 15 and Comparative Examples 9, 10, and 11, the rate at which the aforementioned cracking is generated therein was confirmed. The results thereof are shown in Table 5 of FIG. 11.

From the results shown in Table 5, it can be understood that the radius of curvature of the eighth corner portion 34H having the curved shape should preferably be greater than or equal to 5 μm and less than or equal to 500 μm. More preferably, the radius of curvature should be greater than or equal to 150 μm and less than or equal to 500 μm, and particularly preferably, greater than or equal to 300 μm and less than or equal to 500 μm. If the radius of curvature of the eighth corner portion 34H is greater than 500 μm, it is not preferable, because the optical properties are adversely affected.

The average existence frequency of the minute recesses 35 is greater than or equal to 100,000 and less than or equal to 3 million per 1 mm$^2$. Moreover, as shown in Comparative Example 10, it can be understood that if the minute recesses 35 are reduced by being subjected to smoothing by way of etching, the rate at which cracking is generated is worsened. In Comparative Example 10 as well, the comparatively large sized minute recesses 35 which cannot be removed by etching serve as starting points for cracks, whereby it is considered to worsen the rate at which cracking is generated.

Further, concerning the surface roughness of the transparent sealing member 10 which has a curved shape, it can be understood that it is preferable for the surface roughness to be greater than or equal to 0.01 μm and less than or equal to 0.05 μm. As shown in Comparative Example 9 and Comparative Example 10, when the surface roughness is less than 0.01 μm, the rate at which cracking is generated increases. Further, as shown in Comparative Example 11, when the surface roughness exceeds 0.05 μm, although the rate at which cracking is generated does not increase, it is not preferable, because the optical properties are adversely affected, such as a decrease in linear transmittance or the like.

The transparent sealing member and the method of manufacturing the same according to the present invention are not limited to the above-described embodiments, and it is a matter of course that various configurations can be adopted therein without departing from the essence and gist of the present invention.

The invention claimed is:

1. A transparent sealing member configured to be used for a package in which at least one optical element is accommodated, the transparent sealing member being mounted on a mounting substrate having a mounting surface for the optical element;
    wherein the transparent sealing member includes a plurality of corner portions constituted by surfaces facing toward the mounting substrate, and surfaces extending along the mounting surface of the mounting substrate; among the plurality of corner portions, at least one corner portion has a curved shape; point-shaped minute recesses are formed on a surface of the curved shape; and an average existence frequency of the minute recesses is greater than or equal to 100,000 and less than or equal to 3 million per 1 mm$^2$.

2. The transparent sealing member according to claim 1, wherein a surface roughness of the curved shape having the minute recesses is greater than or equal to 0.01 μm and less than or equal to 0.05 μm.

3. The transparent sealing member according to claim 1, wherein:
    the transparent sealing member is used for the package provided with a concave portion in which the optical element is mounted on the mounting substrate;
    the transparent sealing member integrally comprises a lid configured to close the concave portion, and a lens body that bulges from the lid; and
    the corner portion having the curved shape is constituted by a side surface of the lens body, and a peripheral surface of the lid that surrounds a bottom portion of the lens body.

4. The transparent sealing member according to claim 1, wherein:
    the transparent sealing member is used for the package provided with a concave portion in which the optical element is mounted on the mounting substrate, and further provided with a step on the concave portion;
    the transparent sealing member integrally comprises a lid configured to close the concave portion, and a lens body that bulges from the lid; and
    another corner portion having the curved shape is constituted by a side surface of the lid, and a surface of the lid that faces toward the mounting substrate.

5. The transparent sealing member according to claim 1, wherein:
    the transparent sealing member is used for a package provided with a concave portion in which the optical element is mounted on the mounting substrate, and further provided with a step on the concave portion;
    the transparent sealing member is constituted by a lens body mounted on the step, and which covers the concave portion; and
    the corner portion having the curved shape is constituted by a side surface of the lens body, and a bottom surface of the lens body.

6. The transparent sealing member according to claim 1, wherein:
    the transparent sealing member includes a concave portion surrounding the optical element that is mounted on the mounting surface of the mounting substrate; and
    the corner portion having the curved shape is constituted by an inner peripheral surface of the concave portion, and a bottom surface of the concave portion that faces toward the optical element.

7. The transparent sealing member according to claim 1, wherein:
    the transparent sealing member includes a concave portion surrounding the optical element that is mounted on the mounting surface of the mounting substrate; and
    the corner portion having the curved shape is constituted by an inner peripheral surface of the concave portion, and a surface of the transparent sealing member that is attached to the mounting substrate.

8. The transparent sealing member according to claim 1, wherein the corner portion, which is constituted by an outer peripheral surface of the transparent sealing member and an upper surface of the transparent sealing member, is formed in a curved shape.

9. The transparent sealing member according to claim 1, wherein a radius of curvature of the corner portion having the curved shape is greater than or equal to 5 μm and less than or equal to 500 μm.

10. The transparent sealing member according to claim 1, wherein a constituent material of the transparent sealing member is quartz glass.

11. A method of manufacturing a transparent sealing member, wherein the transparent sealing member is manufactured by a powder sintering method, the transparent sealing member configured to be used for a package in which at least one optical element is accommodated, the transparent sealing member being mounted on a mounting substrate having a mounting surface for the optical element, wherein the transparent sealing member includes a plurality of corner portions constituted by surfaces facing toward the mounting substrate, and surfaces extending along the mounting surface of the mounting substrate; among the plurality of corner portions, at least one corner portion has a curved shape; point-shaped minute recesses are formed on a surface of the curved shape; and an average existence frequency of the minute recesses is greater than or equal to 100,000 and less than or equal to 3 million per 1 $mm^2$.

* * * * *